United States Patent
Niwayama et al.

(10) Patent No.: US 6,875,623 B2
(45) Date of Patent: Apr. 5, 2005

(54) METHOD FOR FABRICATING SEMICONDUCTOR DEVICE

(75) Inventors: Masahiko Niwayama, Kyoto (JP); Kenji Yoneda, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/602,918

(22) Filed: Jun. 25, 2003

(65) Prior Publication Data

US 2004/0023472 A1 Feb. 5, 2004

(30) Foreign Application Priority Data

Jul. 30, 2002 (JP) ........................................ 2002-221087

(51) Int. Cl.[7] .......................... H01L 31/26; H01L 21/66
(52) U.S. Cl. ............................................ 438/14; 438/61
(58) Field of Search ................................ 438/14, 17, 18, 438/35, 45, 61

(56) References Cited

U.S. PATENT DOCUMENTS 5,510,271 A * 4/1996 Rohatgi et al. ............... 438/57
5,981,404 A * 11/1999 Sheng et al. ................ 438/791
6,465,284 B1 * 10/2002 Adachi et al. .............. 438/151
6,590,219 B1 * 7/2003 Ziger ....................... 250/492.2

FOREIGN PATENT DOCUMENTS

JP         63-114135     5/1988

* cited by examiner

Primary Examiner—Phuc T. Dang
(74) Attorney, Agent, or Firm—McDermott Will & Emery LLP (57) ABSTRACT

In the step of thermally processing a semiconductor substrate by irradiating the semiconductor substrate with lamp light, a free carrier absorption layer for absorbing the irradiated lamp light is provided in advance in the semiconductor substrate. Thus, it is possible to increase the temperature controllability in a low temperature range during an RTP process, and to reduce, at a low cost, variations in the substrate temperature not only in a low temperature range but also in a processing temperature range. As a result, semiconductor devices that require precise thermal processing can be fabricated without degrading the characteristics of the resulting semiconductor devices.

20 Claims, 6 Drawing Sheets

METHOD FOR FABRICATING SEMICONDUCTOR DEVICE

BACKGROUND OF THE INVENTION

The present invention generally relates to methods for fabricating a semiconductor device, and in particular relates to methods for fabricating a semiconductor device in which thermal processing is performed using infrared rays.

In fabricating a semiconductor device on a silicon substrate wafer, dopants have to be introduced into the wafer by, for example, ion implantation, vapor phase growth or solid diffusion, and thermal diffusion needs to be caused by conducting high-temperature annealing. In such thermal processing for the fabrication of a semiconductor device, it is essential that appropriate processing conditions be set in order to perform suitable thermal processing on a wafer.

Typical wafer thermal processing that has been conventionally employed is rapid thermal processing (RTP). This thermal processing utilizes light irradiation whereby the wafer can be processed at high temperature within a short period of time. In a general RTP apparatus, a tungsten halogen lamp is used to irradiate a wafer with light having a wavelength of 0.4 $\mu$m to 5.0 $\mu$m and allow the wafer to absorb the light, thereby heating the wafer. Furthermore, a pyrometer (radiation pyrometer) is used to detect infrared irradiation emitted from the bottom surface of the wafer and measure the wafer temperature based on the intensity of the infrared irradiation. Hereinafter, a conventional RTP process will be described with reference to the drawings.

Figure 6:
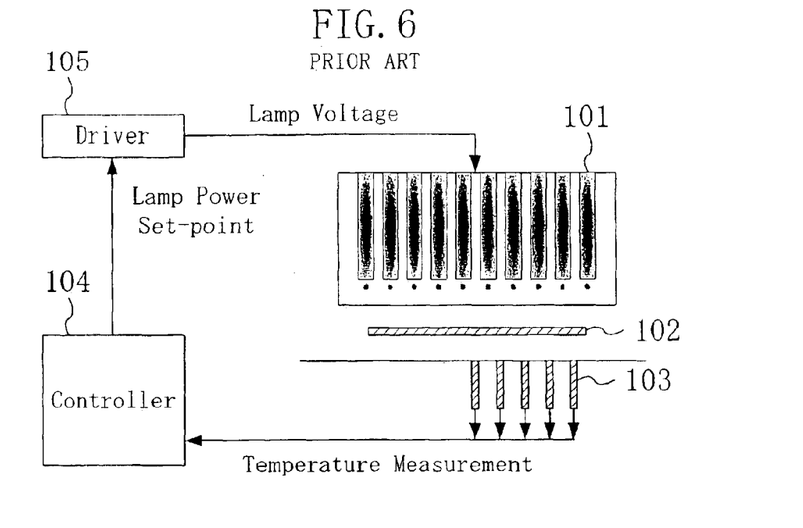
FIG. 6 is a schematic diagram of a conventional RTP apparatus.

FIG. 6 is a schematic diagram of an RTP apparatus of the type that has been conventionally used.

The RTP apparatus includes: a tungsten halogen lamp 101 for heating a semiconductor substrate 102; a pyrometer 103 for measuring the temperature of the semiconductor substrate 102; a controller 104 for controlling the power of the tungsten halogen lamp 101; and a driver 105 for driving the tungsten halogen lamp 101. The pyrometer 103 detects an infrared ray emitted from the wafer to measure the wafer temperature.

It is to be noted that, in order to increase the temperature controllability over the wafer surface, the RTP apparatus is provided with a plurality of the pyrometers 103, thus carrying out temperature measurements at a plurality of points of the semiconductor substrate 102. The results of the temperature measurements are sent to the controller 104 of the RTP apparatus. Next, the controller 104 sends information on the power of the tungsten halogen lamp 101 (a set point for the lamp) to the driver 105 based on the measurement results, and then the tungsten halogen lamp 101 driven by the driver 105 carries out irradiation in accordance with the lamp power information.

Figure 7:
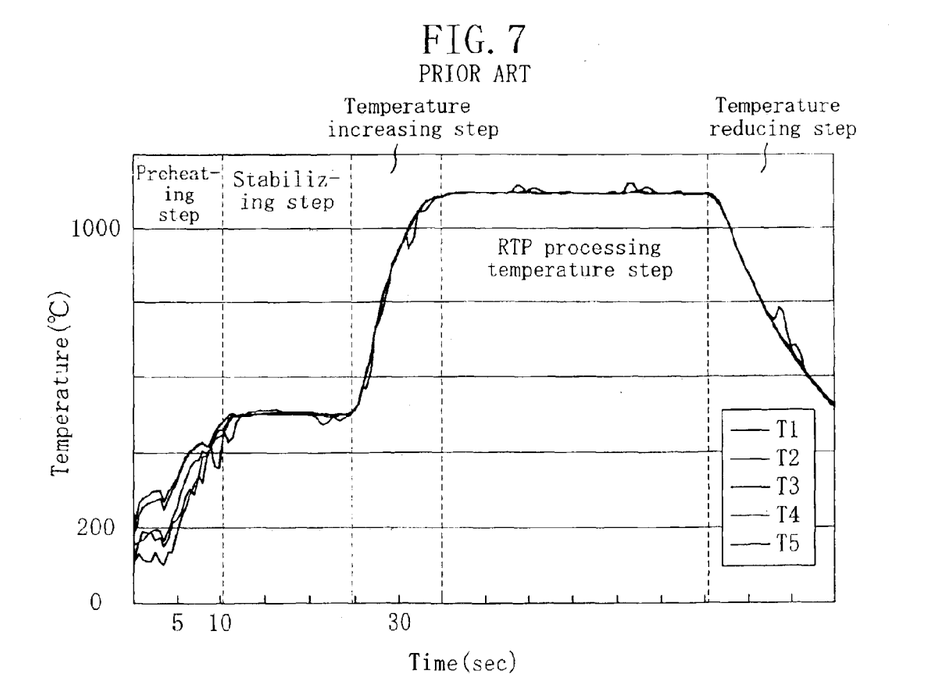
FIG. 7 is a graph showing an exemplary conventional temperature profile during processing carried out by the RTP apparatus.

FIG. 7 is a graph showing an exemplary conventional temperature profile during processing carried out by the RTP apparatus. In the graph, the abscissa represents time while the ordinate represents temperature, and readings of five pyrometers are shown.

As shown in FIG. 7, the conventional RTP process includes: the step of preheating a wafer (herein called a "preheating step"); the step of stabilizing the wafer temperature (herein called a "stabilizing step"); the step of increasing the wafer temperature (herein called a "temperature increasing step"); the step of thermally processing the wafer at a processing temperature (herein called a "processing temperature step"); and the step of reducing the wafer temperature (herein called a "temperature reducing step").

In the example shown in the graph, the preheating step is first performed for about 10 seconds. Thereafter, the wafer is heated to a temperature range in which the controllability of the pyrometers is ensured, and then the temperature of the wafer surface is stabilized. This stabilizing step is performed for about 15 seconds. Subsequently, when the temperature at each point of the wafer has reached a predetermined value, the wafer is increased in temperature to the processing temperature, and thermally processed at the processing temperature for about 30 seconds. Then, the lamp power is shut off to reduce the wafer temperature.

It is to be noted that the wafer surface temperature is stabilized in the temperature range lower than the processing temperature in order to reduce variations in the wafer surface temperature during the processing temperature step.

The temperature profile shown in the graph is just an exemplary one obtained in the RTP process; therefore, the processing temperature and processing time differ depending on the design of the semiconductor device to be fabricated.

As can be seen from the temperature profile shown in FIG. 7, in the conventional RTP process, variations in the wafer surface temperature are observed during the processing temperature step. In order to meet standard requirements for the performance of the product, the RTP process has to be performed at the processing temperature with an accuracy of ±2.5° C. achieved in the temperature profile. However, in the conventional thermal processing method shown in FIG. 7, this condition is not necessarily satisfied.

In the latest semiconductor device fabrication, the period of time required for a processing temperature step in an RTP process may be 10 seconds or shorter, and a spike annealing may be performed in which a wafer is momentarily subjected to thermal processing at the highest possible temperature. In those cases, the above-described nonuniform temperature of applied heat might cause critical problems.

In order to prevent such problems while increasing temperature controllability in a low temperature range, a lamp light source for irradiating a wafer with visible light is used, or a pyrometer or a processing chamber of an RTP apparatus is changed in structure. However, such measures not only make the apparatus expensive but also make it difficult to cope with a wide thermal processing temperature range. Accordingly, the above-mentioned measures are not sufficiently effective.

SUMMARY OF THE INVENTION

The object of the present invention is to provide a method for fabricating a semiconductor device which improves the temperature controllability in an RTP process and makes it possible to reduce temperature variations in a wafer surface at a low cost.

An inventive method for fabricating a semiconductor device includes the steps of: (a) forming at least in a part of a semiconductor substrate a dopant-containing semiconductor layer for absorbing an infrared ray; and (b) thermally processing the semiconductor substrate at a processing temperature by irradiating the semiconductor substrate with an infrared ray.

In this method, the semiconductor layer absorbs an infrared ray due to free carrier absorption even in a low temperature range. Thus, the semiconductor substrate can be heated efficiently to shorten the time of a preheating step.

In one embodiment of the present invention, the step (b) may include the steps of (b1) detecting infrared radiation emitted from the semiconductor substrate; and (b2) measuring the temperature of the semiconductor substrate based on the intensity of the infrared radiation, and controlling the output of the infrared ray. In such an embodiment, the output of the infrared ray can be controlled so as to reduce temperature variations of the semiconductor substrate in the step (b). In particular, in order to prevent the transmittance of an infrared ray through the substrate when the infrared ray has been absorbed by the semiconductor layer due to free carrier absorption in a low temperature range, a fabricator can accurately measure the intensity of the infrared radiation emitted from the semiconductor substrate, thus improving the temperature controllability in a low temperature range. Furthermore, since the same apparatus as the conventional one can be used for the thermal processing, the inventive method will not increase the fabrication cost. Consequently, according to the inventive semiconductor device fabricating method, it is possible to fabricate semiconductor devices that require accurate thermal processing, without degrading the performance of the resulting devices.

In another embodiment of the present invention, the semiconductor substrate is preferably a silicon substrate, and the wavelength of the infrared ray is preferably not less than 0.2 μm nor more than 5.0 μm. In such an embodiment, even in a low temperature range, the semiconductor layer effectively absorbs the infrared ray having a wavelength of this range. Thus, it is possible to increase the temperature controllability during the thermal processing in the step (b).

In still another embodiment, the step (b) may further include the step of maintaining the substrate at a temperature lower than the processing temperature prior to the thermal processing to be performed at the processing temperature, thereby stabilizing the substrate temperature. In such an embodiment, temperature variations in the substrate can be reduced, thus making it possible to thermally process the semiconductor substrate with a higher degree of accuracy.

In the step of stabilizing the substrate temperature, the substrate temperature is preferably stabilized at 700° C. or less.

In the step of stabilizing the substrate temperature, the substrate temperature is more preferably stabilized at 600° C. or less in order to retain the characteristic of the resulting semiconductor device.

In yet another embodiment, infrared radiation emitted from the bottom surface of the semiconductor substrate is detected in the step (b1). In such an embodiment, it is possible to accurately control the output of the infrared ray with which the semiconductor substrate is irradiated. In particular, if a pyrometer for detecting infrared radiation is provided at or to the bottom side of the substrate, the temperature control can be carried out with a precision never before possible because the semiconductor layer prevents, due to free carrier absorption, the transmittance of an infrared ray through the substrate.

In another embodiment of the present invention, the semiconductor layer provided in the step (a) is formed over the entire surface of the semiconductor substrate in plan view. In such an embodiment, the substrate temperature can be controlled with a higher degree of precision in the step (b).

In still another embodiment, an average concentration of the dopant contained in the semiconductor layer is preferably not less than $3 \times 10^{18}$ cm$^{-3}$ nor more than $5 \times 10^{22}$ cm$^{-3}$ This is because if the average concentration of the dopant is below $3 \times 10^{18}$ cm$^{-3}$, it becomes impossible to precisely carry out the temperature control in a low temperature range in the step (b). Further, a concentration of $5 \times 10^{22}$ cm$^{-3}$ is an upper limit for a dopant concentration at which the dopant can be introduced into the semiconductor substrate.

In yet another embodiment, the thickness of the semiconductor layer is 1 μm or more. In such an embodiment, the semiconductor layer can sufficiently absorb an infrared ray. As a result, the temperature controllability in the step (b) can be unprecedentedly improved.

Furthermore, it is particularly preferable that the thickness of the semiconductor layer is 3 μm or more.

The step (a) may include the step of thermally diffusing a dopant into the semiconductor substrate using a gas containing a dopant in its molecules, and the semiconductor layer may be formed in a lower part of the semiconductor substrate.

Alternatively, in the step (a), the semiconductor layer may be formed by dopant ion implantation.

Optionally, in the step (a), the dopant-containing semiconductor layer may be epitaxially grown by a CVD process.

In another embodiment of the present invention, the step (a) may further include the step of forming the semiconductor substrate by bonding a plurality of semiconductor substrates to each other, and at least one of the plurality of substrates may have a semiconductor layer. In such an embodiment, the inventive method is preferably employed, for example, in the case where the semiconductor substrate is an SOI substrate.

In still another embodiment, the inventive method may further include, after the step (a), the step of forming a semiconductor element on the semiconductor substrate, and the step (b) may be performed as a part of the step of forming a semiconductor element on the semiconductor substrate. In such an embodiment, the semiconductor layer can be provided before the semiconductor element is formed. As a result, the semiconductor layer can be formed without hindering the formation of the semiconductor element.

DESCRIPTION OF THE PREFERRED EMBODIMENTS

Improvements made in the conventional RTP process have been mainly focused on the controllability in a processing temperature step. However, it has been found that although the improvement of RTP apparatus is advanced, temperature variations still occur in a processing temperate step.

After through study, the present inventors found that in the conventional RTP process, variations in substrate temperature were wide in a low temperature range, and the wide variations were still observed not only in a stabilizing step but also in a processing temperature step.

In the RTP process, poor controllability in a low temperature range has a bearing on the light absorption characteristic of a silicon substrate. The light absorption characteristic of a silicon substrate varies in accordance with its temperature. Generally, in a temperature range not greater than 700° C., irradiating light from a tungsten halogen lamp substantially transmits through a silicon substrate since the irradiating light is infrared light whose wavelength is greater than that corresponding to the bandgap of silicon. The transmittance of the infrared light is further pronounced when the temperature of the silicon substrate is 500° C. or less. In this case, the pyrometer directly receives the infrared light that has been transmitted through the wafer, and thus detects the transmitted light even though the actual wafer temperature is not raised. Therefore, the pyrometer adversely indicates a value that is higher than the actual wafer temperature, thus making it impossible to exactly know the actual wafer temperature. As a result, the temperature control becomes inaccurate to break the uniformity in the wafer surface temperature during the processing temperature step.

Even if the temperature controllability in a low temperature range is poor, the temperature variations can be reduced to some extent by extending the time of the stabilizing step (the period of time during which the wafer temperature is stabilized). However, if the time of the stabilizing step is too long, the processing performance of the RTP apparatus might be degraded.

In view of this, the present inventors focus their attention on the temperature controllability in the preheating step which has not received attention in the prior art, in order to realize the improvement of the temperature controllability in the processing temperature step.

(First Embodiment)

Figure 1A:
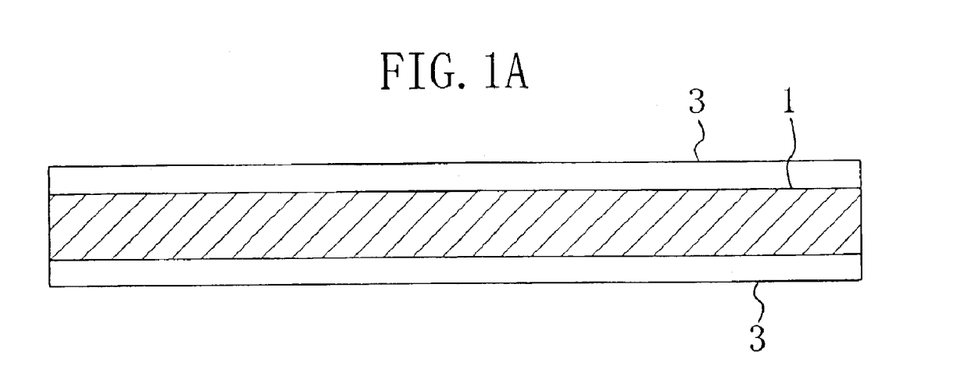
FIGS. 1A through 1C are cross-sectional views illustrating process steps included in a method for fabricating a semiconductor device according to a first embodiment of the present invention.
Figure 1B:
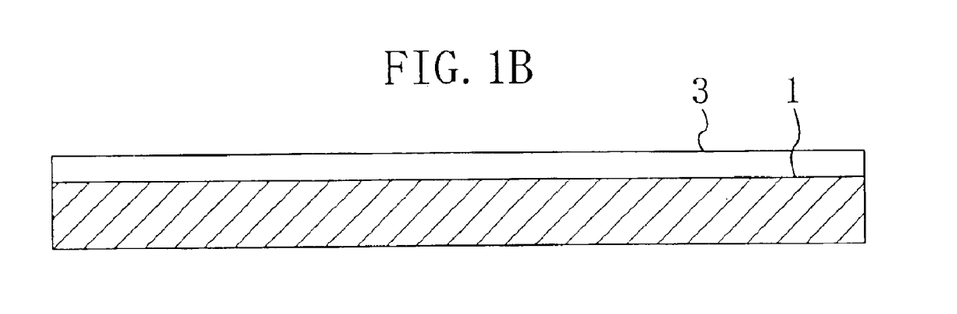
Figure 1C:
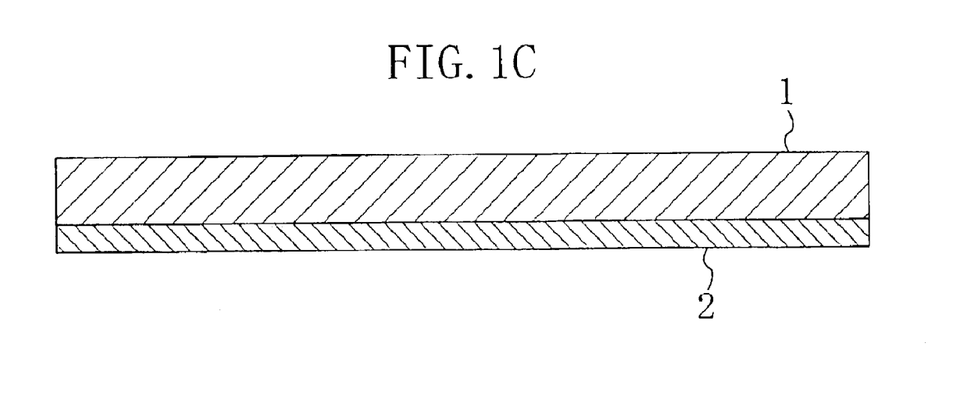

FIGS. 1A through 1C are cross-sectional views illustrating process steps included in a method for fabricating a semiconductor device according to a first embodiment of the present invention.

First, in the step shown in FIG. 1A, a semiconductor substrate 1 made of Si (silicon) is prepared. Then, on each of the top and bottom surfaces of the semiconductor substrate 1, a silicon oxide film 3 is formed by a CVD process, for example.

Next, in the step shown in FIG. 1B, the silicon oxide film 3 on the bottom surface of the semiconductor substrate 1 is removed by a wet etching process.

Subsequently, in the step shown in FIG. 1C, the substrate is subjected to a POCl$_3$ ambient, and thermal diffusion is performed in which a heat of about 850° C. is applied, thus introducing P (phosphorus) into a lower part of the semiconductor substrate 1. In this manner, a free carrier absorption layer (semiconductor layer) 2 containing P with an average concentration of $3 \times 10^{18}$ cm$^{-3}$ or more is formed to a thickness of 3 μm or more in the lower part of the semiconductor substrate 1. In this step, since the silicon oxide film 3 is provided on the top surface of the semiconductor substrate 1, the free carrier absorption layer 2 is formed only in the lower part of the semiconductor substrate 1. Thereafter, the silicon oxide film 3 on the top surface of the semiconductor substrate 1 is removed.

Figure 2A:
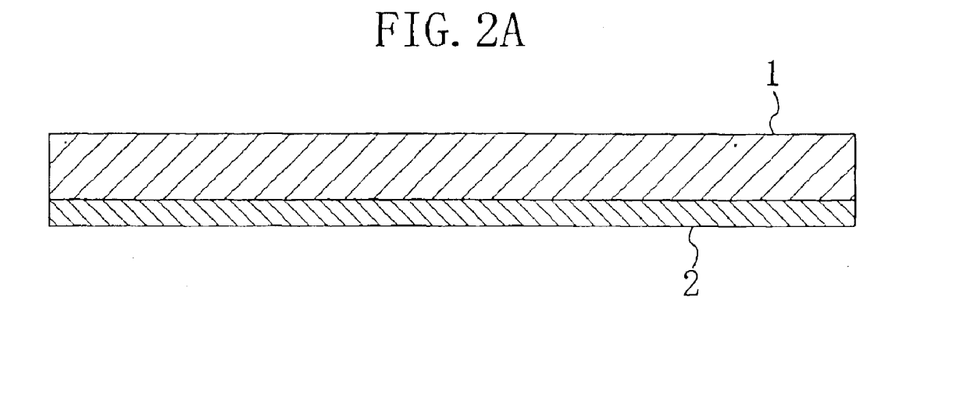
FIG. 2A is a cross-sectional view of a semiconductor substrate used in the semiconductor device fabricating method according to the first embodiment.
Figure 2B:
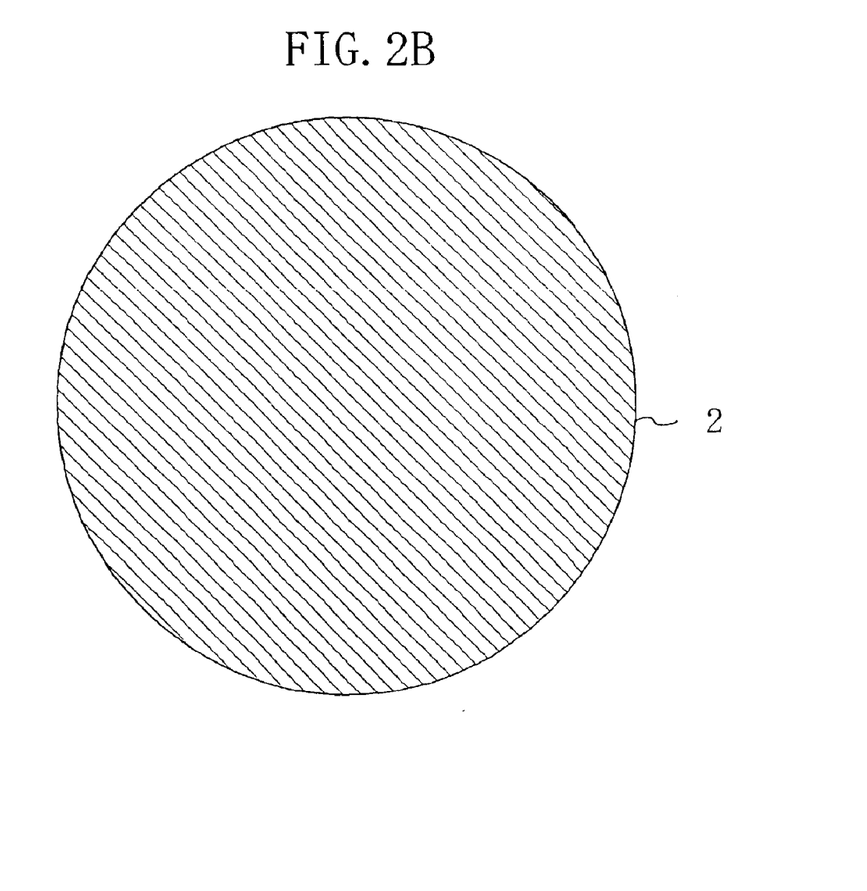
FIG. 2B is a plan view of the semiconductor device.

FIG. 2A is a cross-sectional view of a semiconductor substrate used in the semiconductor device fabricating method according to the first embodiment of the present invention, and 2B is a plan view of the semiconductor device.

The above-described method is performed to obtain the semiconductor substrate 1 provided at its lower part with the free carrier absorption layer 2 having a thickness of 3 μm or more and containing an n-type dopant with an average concentration of $3 \times 10^{18}$ cm$^{-3}$ or more.

Further, as shown in FIG. 2B, the free carrier absorption layer 2 is formed over the entire bottom surface of the wafer semiconductor substrate 1.

Next, the semiconductor substrate 1 is thermally processed by an RTP process. Prior to this thermal processing, a dopant may be introduced into a predetermined position of the substrate, or a semiconductor element may be formed on the substrate. Alternatively, the RTP process may be included in the step of forming the semiconductor element.

In the RTP process according to the present embodiment, an RTP apparatus similar to the conventional RTP apparatus shown in FIG. 6 is used. In other words, the present embodiment uses the RTP apparatus including a tungsten halogen lamp, a pyrometer, a controller, and a driver.

Figure 3:
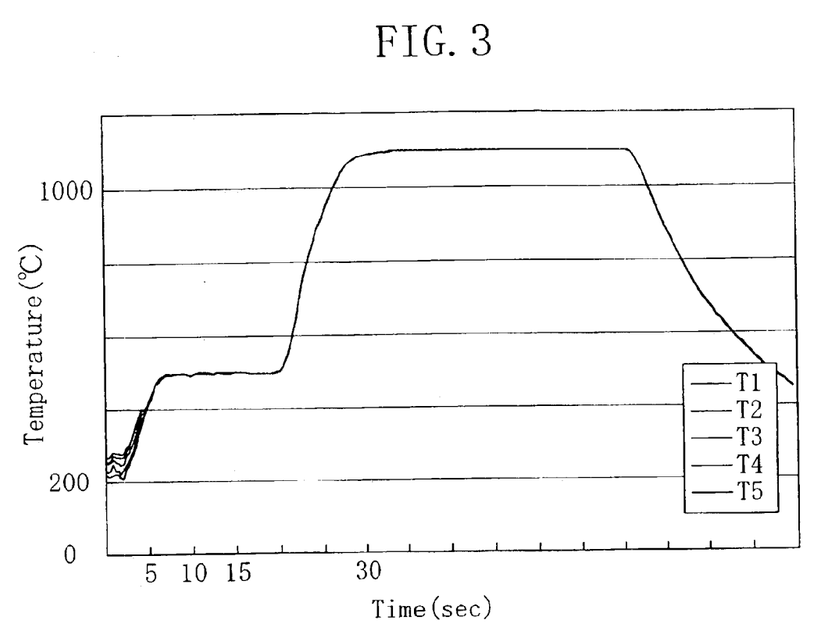
FIG. 3 is a graph showing an exemplary temperature profile during an RTP process in the first embodiment of the present invention.

FIG. 3 is a graph showing an exemplary temperature profile during the RTP process in the present embodiment.

As shown in FIG. 3, the RTP process in the present embodiment is carried out on the conditions that a preheating step is performed for about 5 to about 10 seconds, a stabilizing step is performed at about 500° C. for about 15 seconds, and a processing temperature step is performed at about 1100° C. for about 30 seconds.

In the RTP process in the present embodiment, variations in the wafer temperature reading in the preheating step are extremely small as compared with the conventional RTP process. In addition, the temperature variations in the wafer surface in the stabilizing step are hardly observed. Accordingly, also in the temperature increasing step and processing temperature step, the temperature variations are hardly observed. This goes to show that the thermal processing is performed uniformly on the entire semiconductor substrate 1.

Therefore, according to the semiconductor device fabricating method of the present embodiment, the thermal processing can be accurately carried out at a desired temperature for a predetermined period of time in the RTP process, and thus the performance of the resulting semiconductor device will not be degraded.

Further, according to the method of the present embodiment, since the temperature controllability in a low temperature range is improved, the time of the stabilizing step can be shorter compared with the conventional RTP process, thus enhancing the efficiency of the semiconductor device fabrication and reducing the fabrication cost. Furthermore, the fact that the conventional RTP apparatus can be used as it is contributes to the reduction of the fabrication cost.

The controllability in a low temperature range is improved in the RTP process of the present embodiment because the semiconductor substrate 1 is provided with the free carrier absorption layer 2.

When a dopant has been introduced into silicon, the irradiating light from the tungsten halogen lamp is absorbed due to free carrier absorption even at a temperature of 700° C. or less. Therefore, the temperature of the semiconductor substrate 1 is rapidly increased in the preheating step. As a result, the time of the preheating step can be shortened.

Besides, since the light transmitted through the semiconductor substrate 1 at a temperature of 700° C. or less can be reduced as compared with the case where no free carrier absorption layer is provided, only the infrared light from the semiconductor substrate 1 is allowed to be incident upon the pyrometer. Therefore, the variations in the reading of the pyrometer are eliminated, thus making it possible to accurately measure the temperature of the semiconductor substrate. Consequently, it is possible to improve the controllability over the semiconductor substrate temperature in a low temperature range, and it is also possible to suppress the variations in the substrate temperature at the processing temperature.

The conditions for the RTP process differ depending on the type of the semiconductor device to be fabricated; therefore, the conditions other than those shown in FIG. 3 may be set. Since the method of the present embodiment improves the temperature controllability, this method is effective not only in the case where the time of the processing temperature step is 10 seconds or shorter, but also in the case of a spike annealing in which thermal processing is performed momentarily at a desired temperature after the preheating and stabilizing steps.

In addition, although FIG. 3 shows an example in which the substrate temperature in the stabilizing step (hereinafter, called a "stabilizing temperature") is at about 500° C., it is sufficient that the stabilizing temperature is 700° C. or less. However, in order to prevent the degradation in performance of the resulting semiconductor device, the particularly preferable stabilizing temperature is 600° C. or less.

As described above, according to the semiconductor device fabricating method of the present embodiment, the substrate temperature can be controlled satisfactorily in the RTP process, thus making it possible to fabricate semiconductor devices at a low cost even if the semiconductor devices require accurate thermal processing.

Also, as the lamp used in the RTP apparatus, any lamp is suitable so long as it emits an infrared ray having a wavelength of not less than 0.2 $\mu$m nor more than 5.0 $\mu$ml; therefore, an arc lamp, for example, may be used.

Described below are the results of the study conducted to find out the appropriate thickness of the free carrier absorption layer 2.

Figure 4:
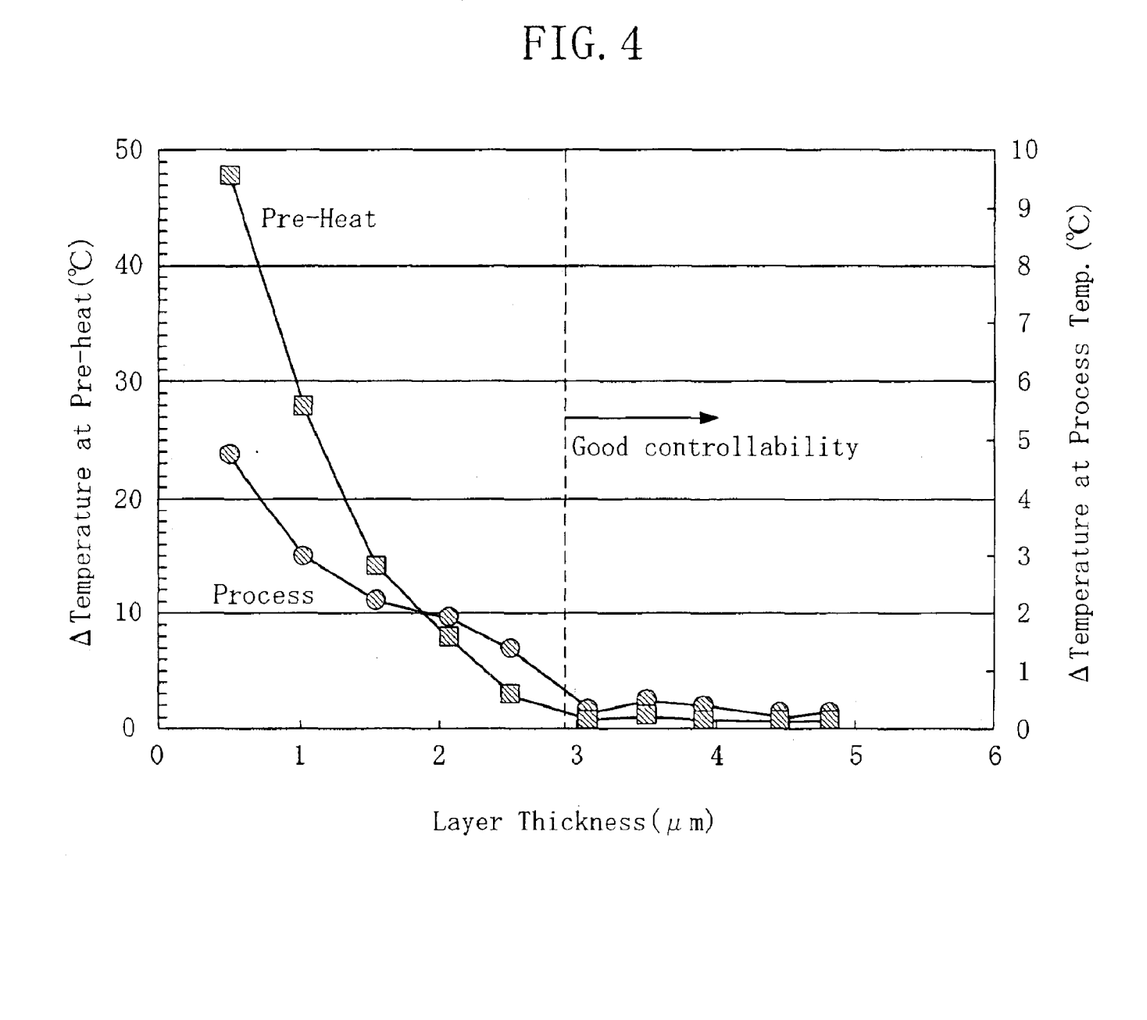
FIG. 4 is a graph showing the relationship between the thickness of a free carrier absorption layer and variations in substrate temperature.

FIG. 4 is a graph showing the relationship between the thickness of the free carrier absorption layer and variations in substrate temperature. In the graph, "Pre-Heat" indicates temperature variations in the temperature increasing step, while "Process" indicates temperature variations in the processing temperature step. The description will be made on the supposition that the free carrier absorption layer contains a dopant with an average concentration of about $3\times10^{18}$ cm$^{-1}$.

As can be seen from FIG. 4, in the temperature increasing step, the substrate temperature variations when the thickness of the free carrier absorption layer is below 3 $\mu$m greatly differ from the substrate temperature variations when the thickness of the layer is 3 $\mu$m or more. That is, if the thickness of the layer is 3 $\mu$m or more, the substrate temperature variations are substantially constant within a range of 2° C. to 3° C.

Also in the processing temperature step, even though the temperature variations when the thickness of the free carrier absorption layer is below 3 $\mu$m are wide, the temperature variations when the thickness of the layer is 3 $\mu$m or more are substantially constant within about 0.2° C.

From these results, we found that the most preferable thickness of the free carrier absorption layer is 3 $\mu$m. However, since semiconductor devices can be fabricated satisfactorily even if the substrate temperature variations fall within about 3° C., it is sufficient that the thickness of the free carrier absorption layer is 1 $\mu$m or more.

On the other hand, the range of a dopant concentration suitable for the free carrier absorption layer is not less than $3\times10^{18}$ cm$^{-3}$ nor more than $5\times10^{22}$ cm$^{-3}$. This is because free carrier absorption generally occurs when the dopant concentration is $3\times10^{18}$ cm$^{-3}$ or more, and the solid solubility limit of the dopant in Si (silicon) is $5\times10^{22}$ cm$^{-3}$.

Further, since free carrier absorption occurs even if either of p-type and n-type dopants is used, the dopant within the free carrier absorption layer in the method of the present embodiment may be either a p-type dopant or an n-type dopant. Usable dopants include, in addition to P (phosphorus), As (arsenic), Sb (antimony), B (boron) and In (indium), for example.

Furthermore, the free carrier absorption layer 2 does not have to be formed in the lower part of the semiconductor substrate 1 but may be formed in inner part and/or upper part of the semiconductor substrate 1. Even in such a case, the free carrier absorption layer 2 absorbs infrared light likewise.

It should be noted that although the free carrier absorption layer 2 is formed to cover the entire surface of the substrate in plan view in the example shown in FIG. 2, the free carrier absorption layer 2 may be a dopant-containing narrow region that is uniformly formed over the entire substrate surface. For example, the free carrier absorption layer 2 may be formed in a chip scribe-line area, or may be formed at the top side of the substrate so that the free carrier absorption layer 2 is used together with a well.

In the method of the present embodiment, the free carrier absorption layer 2 is formed before a semiconductor element is formed on the substrate. Alternatively, the free carrier absorption layer 2 may be formed by introducing a dopant from the bottom side of the substrate during the step of forming a semiconductor element.

(Second Embodiment)

A method for fabricating a semiconductor device according to a second embodiment of the present invention differs from the method of the first embodiment in the step of forming a free carrier absorption layer. Hereinafter, the method of the second embodiment will be described with reference to the drawings.

Figure 5A:
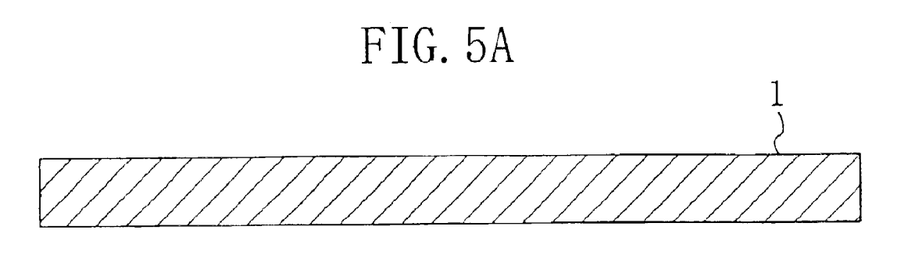
FIGS. 5A and 5B are cross-sectional views illustrating process steps included in a method for fabricating a semiconductor device according to a second embodiment of the present invention.
Figure 5B:
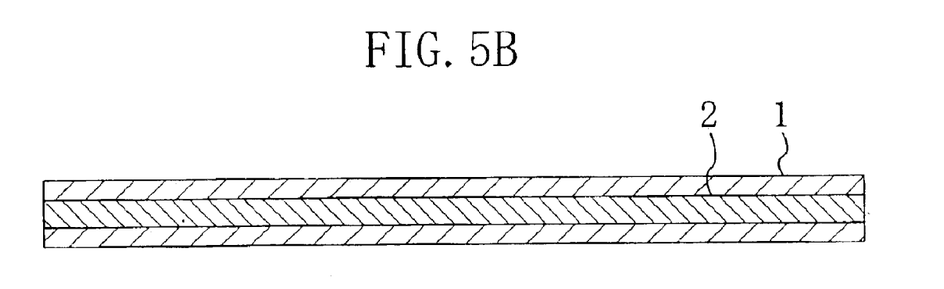

FIGS. 5A and 5B are cross-sectional views illustrating process steps included in the semiconductor device fabricating method according to the second embodiment of the present invention.

First, in the step shown in FIG. 5A, a semiconductor substrate 1 made of Si (silicon) is prepared.

Next, in the step shown in FIG. 5B, ion implantation is carried out to implant n-type dopant ions into a region of the semiconductor substrate 1 at a depth of 3 $\mu$m or more from the top surface thereof. In this manner, a free carrier absorption layer 2 with an average dopant concentration of $3\times10^{18}$ cm$^{-3}$ or more is formed to a thickness of 3 $\mu$m or more. Thereafter, a semiconductor device is fabricated on the semiconductor substrate 1.

Furthermore, an RTP process is performed during the fabrication of a semiconductor device. In this case, the RTP apparatus is the same as that used in the first embodiment, and the conditions for the RTP process are the same as those set in the first embodiment.

If the semiconductor substrate obtained by the method of the present embodiment is used, the temperature controllability in the RTP process can be improved because the free carrier absorption layer 2 absorbs lamp light event at 700° C. or less. Therefore, like the first embodiment, the temperature variations in the semiconductor substrate surface are suppressed, and thus accurate thermal processing can be carried out. Besides, the time of a stabilizing step can be shortened, thus increasing the fabrication efficiency. In addition, since the conventional RTP apparatus can be used as it is, the fabrication cost of the present embodiment is similar to that of the conventional method.

Further, the dopant contained in the free carrier absorption layer 2 may be a p-type dopant instead of an n-type dopant.

Furthermore, the ion implantation may be carried out from the bottom side of the semiconductor substrate 1.

In the method of the present embodiment, the free carrier absorption layer 2 is formed before a semiconductor element is formed on the substrate. Alternatively, the free carrier absorption layer 2 may be formed during the step of forming a semiconductor element.

(Other Embodiments)

In a semiconductor substrate used in the inventive semiconductor device fabricating method, a free carrier absorption layer may be formed by a CVD process instead of dopant thermal diffusion or dopant ion implantation.

Specifically, a free carrier absorption layer of Si (silicon) containing a dopant due to in-situ doping may be epitaxially grown on the bottom surface of a semiconductor substrate. In such a case, it is sufficient that the thickness of the free carrier absorption layer is 1 $\mu$m or more and an average dopant concentration is $3 \times 10^{18}$ cm$^{-3}$ or more. Furthermore, the thickness of the free carrier absorption layer is more preferably 3 $\mu$m or more.

Besides, a plurality of semiconductor substrates may be bonded to each other. Such bonding is carried out in fabricating an SOI (Silicon on Insulator) substrate, for example. In this case, any one of the bonded substrates may have a dopant-containing layer as a free carrier absorption layer, or the bonded substrates may have, as a whole, a dopant concentration enough to obtain a free carrier absorption layer.

In order to further improve the temperature controllability in an RTP process, the Si (silicon) surface of a semiconductor substrate may be exposed by cutting away the bottom surface portion of the semiconductor substrate.

The present application claims the priority of Japanese Patent Application Number 2002-221087, the disclosure of which is incorporated herein by reference.

What is claimed is:

1. A method for fabricating a semiconductor device, comprising the steps of:
   (a) forming at least in a part of a semiconductor substrate a dopant-containing semiconductor layer for absorbing an infrared ray; and
   (b) thermally processing the semiconductor substrate at a processing temperature by irradiating the semiconductor substrate with an infrared ray;
   wherein the semiconductor layer provided in the step (a) is formed over the entire surface of the semiconductor substrate in plan view.

2. The method of claim 1, wherein the step (b) comprises the steps of:
   (b1) detecting infrared radiation emitted from the semiconductor substrate; and
   (b2) measuring the temperature of the semiconductor substrate based on the intensity of the infrared radiation, and controlling the output of the infrared ray.

3. The method of claim 1, wherein the semiconductor substrate is a silicon substrate, and
   wherein the wavelength of the infrared ray is not less than 0.2 $\mu$m nor more than 5.0 $\mu$m.

4. The method of claim 1, wherein the step (b) further comprises the step of maintaining the substrate at a temperature lower than the processing temperature prior to the thermal processing to be performed at the processing temperature, thereby stabilizing the substrate temperature.

5. The method of claim 1, wherein in the step of stabilizing the substrate temperature, the substrate temperature is stabilized at 700° C. or less.

6. The method of claim 1, wherein in the step of stabilizing the substrate temperature, the substrate temperature is stabilized at 600° C. or less.

7. The method of claim 2, wherein in the step (b1), infrared radiation emitted from the bottom surface of the semiconductor substrate is detected.

8. The method of claim 1, wherein an average concentration of the dopant contained in the semiconductor layer is not less than $3 \times 10^{18}$ cm$^{-3}$ nor more than $5 \times 10^{22}$ cm$^{-3}$.

9. The method of claim 1, wherein the thickness of the semiconductor layer is 1 $\mu$m or more.

10. The method of claim 1, wherein the thickness of the semiconductor layer is 3 $\mu$m or more.

11. The method of claim 1, wherein the step (a) comprises the step of thermally diffusing a dopant into the semiconductor substrate using a gas containing a dopant in its molecules, and
    wherein the semiconductor layer is formed in a lower part of the semiconductor substrate.

12. The method of claim 1, wherein in the step (a), the semiconductor layer is formed by dopant ion implantation.

13. The method of claim 1, wherein in the step (a), the dopant-containing semiconductor layer is epitaxially grown by a CVD process.

14. The method of claim 1, wherein the step (a) further comprises the step of forming the semiconductor substrate by bonding a plurality of semiconductor substrates to each other, and
    wherein at least one of the plurality of substrates has a semiconductor layer.

15. The method of claim 1, wherein the method further comprises, after the step (a), the step of forming a semiconductor element on the semiconductor substrate, and
    wherein the step (b) is performed as a part of the step of forming a semiconductor element on the semiconductor substrate.

16. A method for fabricating a semiconductor device, comprising the steps of:
    (a) forming at least in a part of a semiconductor substrate a dopant-containing semiconductor layer for absorbing an infrared ray; and
    (b) thermally processing the semiconductor substrate at a processing temperature by irradiating the semiconductor substrate with an infrared ray;
    wherein the step (b) further comprises the step of maintaining the substrate at a temperature lower than the processing temperature prior to the thermal processing to be performed at the processing temperature, thereby stabilizing the substrate temperature.

17. A method for fabricating a semiconductor device, comprising the steps of:
(a) forming at least in a part of a semiconductor substrate a dopant-containing semiconductor layer for absorbing an infrared ray; and
(b) thermally processing the semiconductor substrate at a processing temperature by irradiating the semiconductor substrate with an infrared ray,
wherein the step (b) comprises the steps of:
(b1) detecting infrared radiation emitted from the semiconductor substrate; and
(b2) measuring the temperature of the semiconductor substrate based on the intensity of the infrared radiation, and controlling the output of the infrared ray; and
wherein in the step (b1), infrared radiation emitted from the bottom surface of the semiconductor substrate is detected.

18. A method for fabricating a semiconductor device, comprising the steps of:
(a) forming at least in a part of a semiconductor substrate a dopant-containing semiconductor layer for absorbing an infrared ray; and
(b) thermally processing the semiconductor substrate at a processing temperature by irradiating the semiconductor substrate with an infrared ray;
wherein the step (a) comprises the step of thermally diffusing a dopant into the semiconductor substrate using a gas containing a dopant in its molecules; and
wherein the semiconductor layer is formed in a lower part of the semiconductor substrate.

19. A method for fabricating a semiconductor device, comprising the steps of:
(a) forming at least in a part of a semiconductor substrate a dopant-containing semiconductor layer for absorbing an infrared ray; and
(b) thermally processing the semiconductor substrate at a processing temperature by irradiating the semiconductor substrate with an infrared ray;
wherein the step (a) further comprises the step of forming the semiconductor substrate by bonding a plurality of semiconductor substrates to each other; and
wherein at least one of the plurality of substrates has a semiconductor layer.

20. A method for fabricating a semiconductor device, comprising the steps of:
(a) forming at least in a part of a semiconductor substrate a dopant-containing semiconductor layer for absorbing an infrared ray; and
(b) thermally processing the semiconductor substrate at a processing temperature by irradiating the semiconductor substrate with an infrared ray;
wherein the method further comprises, after the step (a), the step of forming a semiconductor element on the semiconductor substrate; and
wherein the step (b) is performed as a part of the step of forming a semiconductor element on the semiconductor substrate.

* * * * *